United States Patent
Keysar et al.

(10) Patent No.: US 10,121,771 B2
(45) Date of Patent: Nov. 6, 2018

(54) TARGET INTEGRATED CIRCUIT COMBINED WITH A PLURALITY OF PHOTOVOLTAIC CELLS

(71) Applicant: Sol Chip Ltd., Haifa (IL)

(72) Inventors: Shani Keysar, Haifa (IL); Doron Pardess, Nahariya (IL); Rami Friedlander, Zichron Yaakov (IL)

(73) Assignee: Sol Chip Ltd., Haifa (IL)

( * ) Notice: Subject to any disclaimer, the term of this patent is extended or adjusted under 35 U.S.C. 154(b) by 0 days.

(21) Appl. No.: 15/443,473

(22) Filed: Feb. 27, 2017

(65) Prior Publication Data

US 2017/0256526 A1    Sep. 7, 2017

Related U.S. Application Data

(60) Provisional application No. 62/302,212, filed on Mar. 2, 2016.

(51) Int. Cl.
| | |
|---|---|
| *H01L 25/16* | (2006.01) |
| *H01L 31/048* | (2014.01) |
| *H01L 25/00* | (2006.01) |
| *H01L 31/02* | (2006.01) |
| *H01L 31/054* | (2014.01) |
| *H01L 23/58* | (2006.01) |
| *H01L 23/00* | (2006.01) |

(52) U.S. Cl.
CPC ............ *H01L 25/167* (2013.01); *H01L 23/58* (2013.01); *H01L 24/16* (2013.01); *H01L 25/50* (2013.01); *H01L 31/02008* (2013.01); *H01L 31/0481* (2013.01); *H01L 31/054* (2014.12); *H01L 2224/16145* (2013.01)

(58) Field of Classification Search
None
See application file for complete search history.

(56) References Cited

U.S. PATENT DOCUMENTS

| | | |
|---|---|---|
| 2003/0152815 A1 | 8/2003 | Lafollette et al. |
| 2017/0256526 A1* | 9/2017 | Keysar ................. H01L 25/167 |

* cited by examiner

*Primary Examiner* — Long Pham
(74) *Attorney, Agent, or Firm* — M&B IP Analysts, LLC

(57) ABSTRACT

A microchip structure and a method for manufacturing thereof are provided. The microchip structure comprises a target integrated circuit (TIC) comprising a first surface and a first power contact at a first location on the first surface of the TIC, the TIC further comprising a second power contact at a second location on the first surface of the TIC; a plurality of photovoltaic (PV) diodes deposited on a first surface of a transparent substrate, each of the PV diodes having an anode coupled to an anode contact and a cathode coupled to a cathode contact, the transparent substrate is transparent to an electromagnetic frequency to which the PV diodes are sensitive; the cathode contact of a first PV diode of the PV diodes is bonded to the first power contact and the anode contact of a second PV diode of the PV diodes is bonded to the second power contact.

18 Claims, 4 Drawing Sheets

TARGET INTEGRATED CIRCUIT
COMBINED WITH A PLURALITY OF
PHOTOVOLTAIC CELLS

CROSS-REFERENCE TO RELATED
APPLICATIONS

This application claims priority from US Provisional Patent Application No. 62/302,212 filed on Mar. 2, 2016 which is hereby incorporated by reference for all that it contains.

TECHNICAL FIELD

The disclosure generally relates to self-powered integrated circuits and, in particular, to solar self-powered integrated circuits.

BACKGROUND

Integrated circuits (ICs) or chips designed using, for example, a very-large-scale integration (VLSI) process, typically draw power from external sources such as grid power (mains), batteries, or the like. However, a drawback with battery-operated devices is that electrochemical power cells often run out of power at inconvenient times and, therefore, batteries need to be regularly recharged or replaced. Thus, there is an industry trend to provide ICs which are self-powered and require little-to-no intervention from users for the IC to function. Internet-of-Things (IoT) is a field where demand for such devices is growing.

Furthermore, such self-powered (e.g., solar powered) components could be effectively used in applications where a power supply is unavailable. Self-powering components may therefore be utilized in a variety of stand-alone communication units, road signs for remote locations, in buoys, floats or other maritime applications.

Attempts have been made to connect VLSI chips to elements, such as photovoltaic cells (PVs), in order that they might draw solar power therefrom. However, the chips and photovoltaic cells are generally manufactured separately and later connected together using external wiring, gates, contacts or terminals.

The current solutions can be difficult to manufacture, especially given the need to ensure that the light sensitive portion of the photovoltaic element can be exposed to light.

It would therefore be advantageous to provide a solution that would overcome the deficiencies of the prior art.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" may be used herein to refer to a single embodiment or multiple embodiments of the disclosure.

Some embodiments disclosed herein include a microchip structure comprising a target integrated circuit (TIC) comprising a first power contact at a first location on a first surface of the TIC, and a second power contact at a second location on the first surface of the TIC; a plurality of photovoltaic (PV) diodes deposited on a first surface of a transparent substrate, each of the plurality of PV diodes having an anode coupled to an anode contact and a cathode coupled to a cathode contact, wherein the transparent substrate is transparent to an electromagnetic (EM) frequency to which the plurality of PV diodes are sensitive; and wherein at least the cathode contact of a first PV diode of the plurality of PV diodes is bonded to the first power contact and at least the anode contact of a second PV diode of the plurality of PV diodes is bonded to the second power contact.

Some embodiments disclosed herein include a method for manufacturing a microchip structure. The method comprises forming a plurality of photovoltaic (PV) diodes on a first surface of a transparent substrate, each of the plurality of PV diodes having an anode coupled to a respective anode contact and a cathode coupled to a respective cathode contact, wherein the transparent substrate is transparent to an electromagnetic (EM) frequency to which the plurality of PV diodes are sensitive and a surface of each of the plurality of PV diodes for receiving light to convert to electricity faces the transparent substrate such that the light for conversion to electricity can only be received at the plurality of PV diodes after passing through the transparent substrate; bonding at least the cathode contact of a first PV diode of the plurality of PV diodes to a first power contact located at a first location on a first surface of a target integrated circuit (TIC); and bonding at least the anode contact of a second PV diode of the plurality of PV diodes to a second power contact located at a second location on the first surface of the TIC.

BRIEF DESCRIPTION OF THE DRAWINGS

The subject matter disclosed herein is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION

Figure 1A:
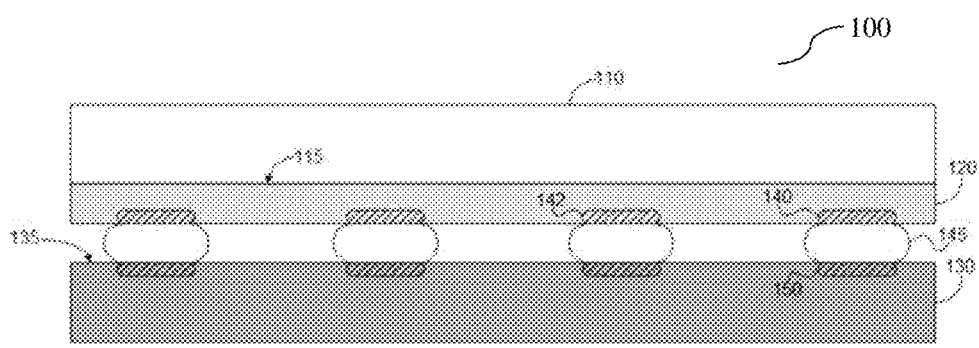
FIG. 1A is a two-dimensional cross-sectional-type schematic illustration of a microchip structure in accordance with an embodiment.

The embodiments disclosed herein are only examples of the many possible advantageous implementations of the innovative teachings presented herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like elements throughout.

By way of example, a microchip structure is provided. In one embodiment, the microchip structure includes a target integrated circuit (IC) coupled to a transparent substrate. The substrate includes a plurality of photovoltaic (PV) diodes deposited thereon. In an embodiment, the microchip structure is a flip-chip semiconductor device.

In an example embodiment, the transparent substrate is transparent to an electromagnetic (EM) frequency to which the plurality of PV diodes are sensitive. This may be one or more EM frequency regions such as near ultraviolet, near infrared, mid infrared, and far infrared. Each of the plurality of PV diodes includes an anode and a cathode, where each anode is coupled to a respective anode contact and each cathode is coupled to a respective cathode contact. The anode and cathode contacts are located on a first surface of the transparent substrate. Each anode and each cathode is coupled to power contacts on a first surface of the IC. In an embodiment, the coupling may be achieved to mechanical and electrical bonding.

FIG. 1A is an example of a two-dimensional cross-sectional-type schematic diagram of a microchip structure (MCS) 100 structured according to an embodiment. The MCS 100 includes a target integrated circuit (TIC) 130, which has a plurality of power contacts on a first surface 135 of the TIC, such as power contact 150. The TIC 130 may include input/output (I/O) contacts (shown in FIG. 2) in some embodiments. The TIC 130 may serve many self-powering electric components, such as internet of things (IoT) chips, wireless sensors, wireless tags, and so on. Wireless sensors can be used for, for example, security applications, agricultural applications, home automation, and the like.

According to an embodiment, the MCS 100 further includes a transparent substrate 110. In an embodiment, a plurality of photovoltaic (PV) diodes 120 are fabricated on a first surface 115 of the transparent substrate 110. In certain embodiments, a single PV diode 120 may be fabricated in place of the plurality of PV diodes 120. In an embodiment, the transparent substrate 110 is transparent to an electromagnetic (EM) frequency to which the PV diodes 120 are sensitive. Different substrates may therefore be transparent to different EM frequencies. For example, glass or silicon material is typically transparent with respect to visible light but not with respect to infrared.

In some embodiments, a layer of material (not shown) may be applied to be part, or whole, of the substrate 110 to act as a filter so as to further filter certain EM frequencies. For example, the filter could filter the EM radiation corresponding to a frequency of any one or more of the: near ultraviolet, near infrared, mid infrared, and far infrared bands. The PV diodes 120 may be fabricated integrally on the transparent substrate 110. For example, glass may be fabricated on the transparent substrate 110 to filter ultraviolet light, while allowing visible light to pass.

In one embodiment, the fabrication may be achieved by using chemical vapor deposition to deposit the various layers that make up the PV diodes 120. In another embodiment, the PV diodes 120 may be fabricated separately from the transparent substrate 110 and then bonded to the substrate 110.

In certain embodiments, a surface of each of the plurality of PV diodes 120 faces the transparent substrate 110 such that the light for conversion is received after passing through the transparent substrate 110. Thus, the surface of each PV diode 120 may allow for receiving light to be converted to electricity. The transparent substrate 110 may be sufficiently rigid to, for example, maintain a surface substantially planar regardless of the substrate's orientation. The surface may be, e.g., the surface which the PV diodes 120 face, or its opposing surface.

Figure 1B:
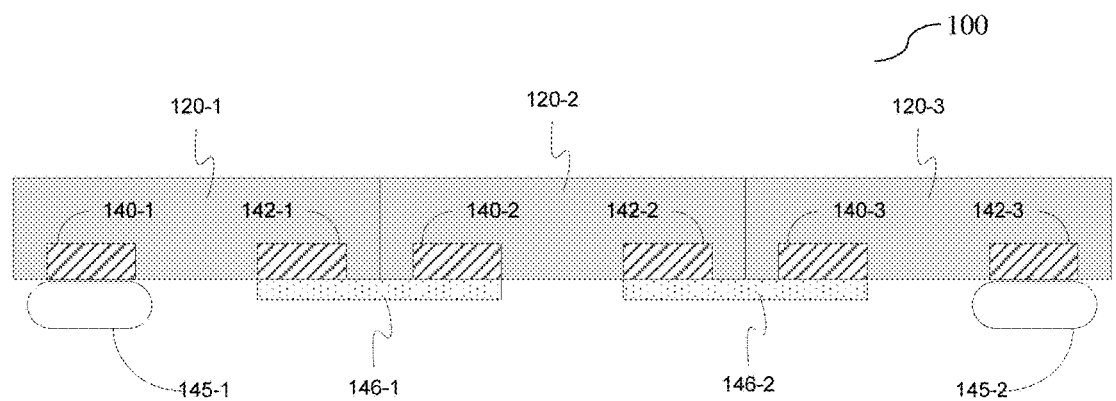
FIG. 1B is a schematic illustration of a plurality of PV diodes, arranged in accordance with an embodiment.

Reference is now made to FIG. 1B, which is an exemplary and non-limiting schematic illustration of a plurality of PV diodes, arranged in the MCS 100, in accordance with an embodiment. Each PV diode 120-1 through 120-3 includes an anode and a cathode. Each anode has a contact, such as one of the anode contacts 140-1 through 140-3, and each cathode has a cathode contact, such as one of the cathode contacts 142-1 through 142-3. At least one anode contact 140-1 of at least one of the PV diodes, e.g., the first PV diode 120-1, and at least one cathode contact 142-3 of one of the PV diodes, e.g., a third PV diode 120-3, are bonded to the TIC 130 at solder bumps 145-1 and 145-2, respectively. This is performed so as to arrange at least a portion of the first surface 115 of the transparent substrate 110 to be facing the first surface 135 of the TIC 130.

In some embodiments, the anode contact 140-3 of the third PV diode 120-3 is connected with the cathode contact 142-2 of the second PV diode 120-2 via a connector 146-2. Connections may be formed via the connector 146-2 by depositing a conductive material, by doping the substrate to allow conductivity, and the like. It is readily understood that a portion of the plurality of PV diodes 120-1 through 120-3 may be connected serially such that the anode of PV diode i is connected to the cathode of the cathode of PV diode i+1, and the anode of PV diode i+1 is connected to the cathode of PV diode i+2, etc., up to i+n, where 'n' is an integer number equal to or greater than '1', and 'i' is a value from '1' to 'n'.

As a non-limiting example, the cathode 142-1 of PV diode 120-1 is connected via a connector 146-1 to the anode 140-2 of the PV diode 120-2. While three PV diodes are presented, it should be understood that 1 through 'n' such PV diodes may be used without departing from the scope of the disclosed embodiments, where 'n' is an integer value equal to or greater than 1, arranged and connected in different schemes as required.

In certain embodiments, the PV diodes 120-1 through 120-3 may be connected to a switching circuit, which may connect each PV diode 120 to a load, or disconnect the PV diode 120 therefrom. A load may be, for example, a sensor, an energy storage, and the like. In some embodiments, where there are multiple PV diodes, the switching circuitry may connect, or disconnect, a subset of the multiple PV diodes to one or more loads of a plurality of loads. For example, ten PV diodes may be grouped into two groups of five PV diodes each, such that the switching circuitry may connect the first group to a load, the second group to another load, both groups to the load, both groups to another load, and so on.

Figure 2:
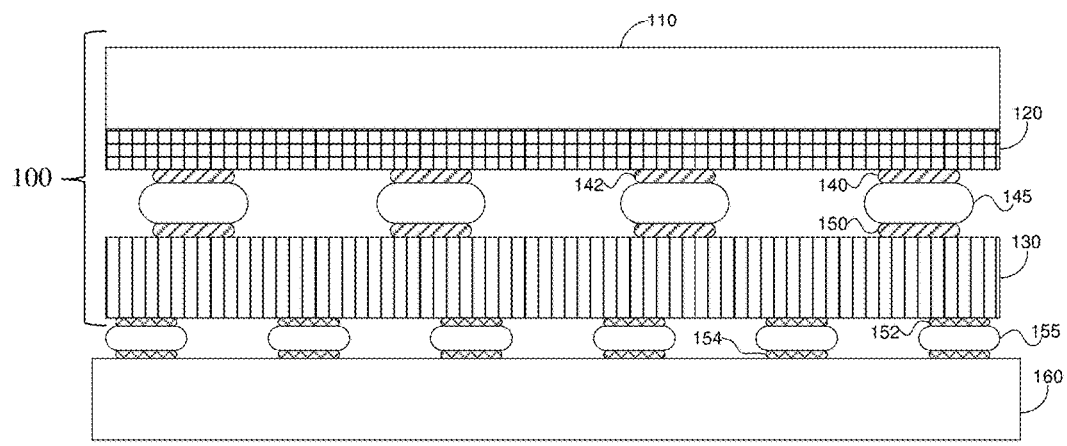
FIG. 2 is a two-dimensional schematic illustration of a microchip structure on a substrate in accordance with an embodiment.

In one embodiment, bonding the PV diodes 120 to the power contacts of the TIC 130 may be performed by using solder bumps. FIG. 2 is an example two-dimensional schematic illustration of the MCS 100 on a substrate in accordance with an embodiment. As shown in FIG. 2, the solder bump 145 connects the anode contact 140 to the power contacts 150. This results in a flip-chip structure and the use of a solder bump provides both electrical and mechanical bonding. It is readily understood that other methods of connection, such as anisotropic adhesives, may be used to bond the contacts without departing from the scope of the disclosed embodiments.

In this embodiment, the MCS 100 (discussed above with reference to FIG. 1) is connected to a substrate, such as a printed circuit board (PCB) 160. The PCB 160 has a plurality of incoming contacts, such as PCB I/O contacts 154. Each PCB I/O contact 154 is connected to a TIC I/O contact 152. In this example embodiment, the PCB I/O contact 154 is connected to the TIC I/O contact 152 via a solder bump 155. It is readily understood that other methods of connection may be used to connect the contacts without departing from the scope of the disclosed embodiment. The PCB 160 may be further connected to an energy storage unit, or other TICs, in some example embodiments. The substrate may serve to connect the MCS 100 to additional components, with which it may communicate, supply power to, or both. In another example embodiment, the substrate may be a multi-chip module.

Figure 3:
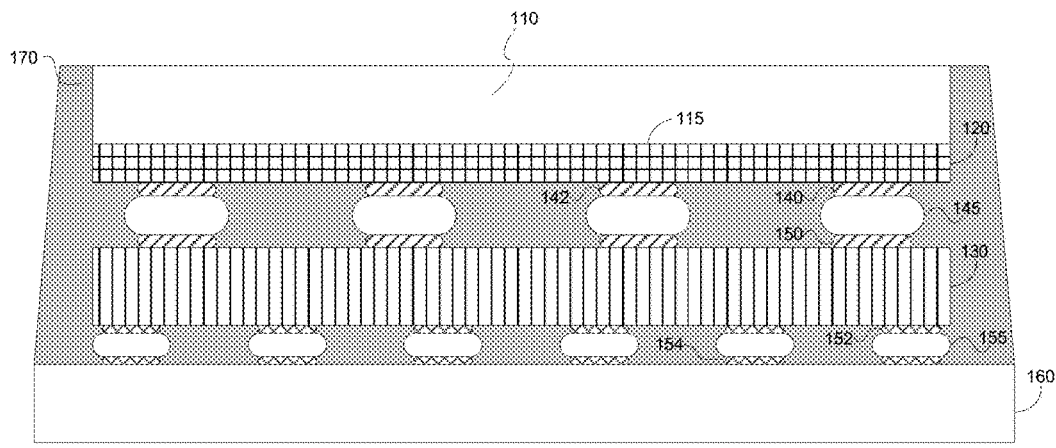
FIG. 3 is a two-dimensional schematic illustration of a microchip structure on a printed circuit board (PCB) in an enclosure in accordance with an embodiment.

FIG. 3 is an example two-dimensional schematic illustration of the MCS 100 on a PCB 160 in an enclosure in accordance with an embodiment.

Typically for commercial use, a microchip structure will require an enclosure. This may be done, for example, to withstand outdoor elements. After connecting the PV diodes 120 to the TIC 130, the MCS 100 may be filled with a filler 170, for example an epoxy resin. The filler 170 forms an enclosure for the MCS 100. Typically, the filler 170 is hardened and electrically insulating.

Figure 4:
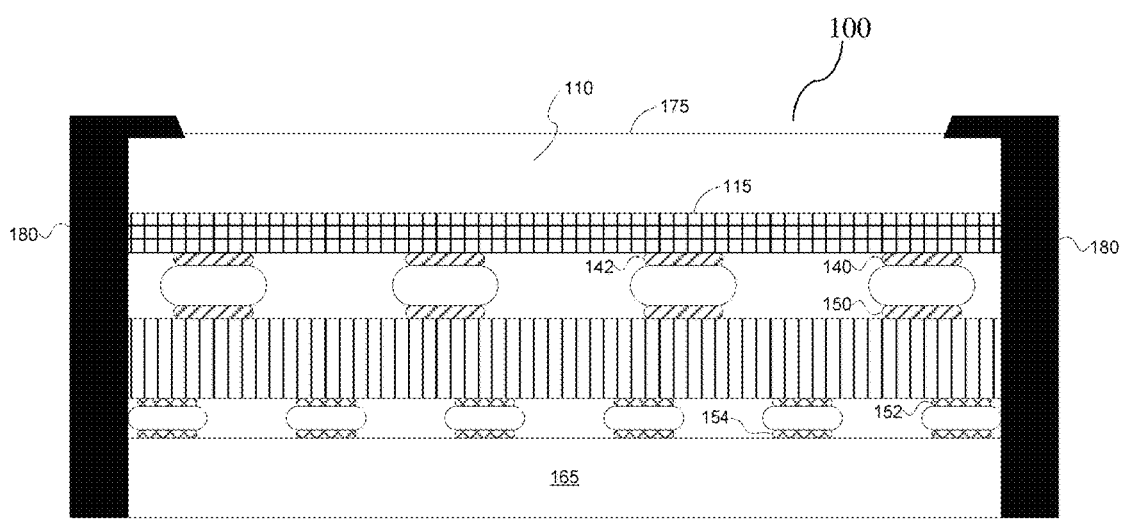
FIG. 4 is a two-dimensional schematic illustration of a microchip structure on a PCB in an alternative enclosure in accordance with another embodiment.

FIG. 4 is an example two-dimensional schematic illustration of the MCS 100 on the PCB 160 in an alternative enclosure in accordance with another embodiment. In this example embodiment, the enclosure is structured as a package 180. To this end, the MCS 100 is connected to a substrate 165, and enclosed by the package 180. The package 180 encompasses the MCS 100. The package 180 may be, for example, an epoxy resin, ceramic, and the like.

In some embodiments, the package 180 may protrude over a second surface 175 of the transparent substrate 110 to provide additional enclosure. The second surface of the transparent substrate 110 is opposite to the first surface 115 of the transparent substrate 110, such that that normal vectors of the surfaces are facing away from each other.

Figure 5:
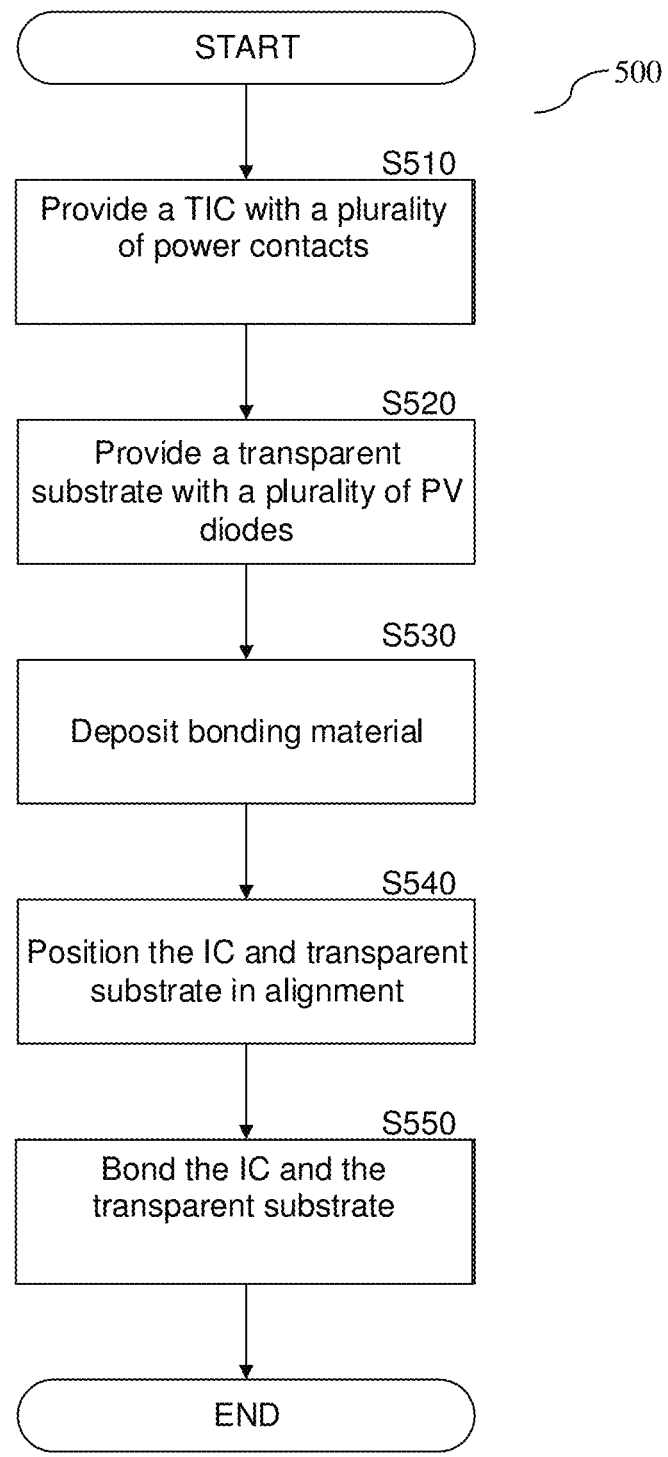
FIG. 5 is a flowchart of a method for fabricating a solar flip-chip structure, in accordance with an embodiment.

FIG. 5 is an example flowchart 500 illustrating a method for fabricating a microchip structure, in accordance with an embodiment. At S510, a TIC is provided. The TIC includes a plurality of power contacts on a first surface of the TIC, such as the power contacts 150, FIG. 1.

At S520, a transparent substrate with a plurality of PV diodes deposited on the first surface of the TIC is provided. The transparent substrate has a first surfaces. Each PV diode includes a cathode contact and an anode contact. The PV diodes may be deposited, for example, as thin film PV diodes.

At S530, a bonding material is deposited on at least two of the plurality of power contacts of the TIC. The bonding material may be a solder bump, such as the solder bump 155, FIG. 1. In other embodiments, solder bumps may be deposited on at least a cathode contact of a PV diode, e.g., a first PV diode, and at least an anode contact of a PV diode, e.g., a second PV diode of the plurality of PV diodes. It is readily understood that other materials which are electrically conductive and can bond a power contact to a contact of a PV diode can be used without departing from the scope of the disclosure.

At S540, the TIC and the transparent substrate are positioned so that at least a portion of the first surface of the transparent substrate is facing at least a portion of the first surface of the TIC, and further positioned so that one of the at least two power contacts is facing the cathode contact of the first PV diode and the second of the at least two power contacts is facing the anode contact of the second PV diode.

At S550, the IC and transparent substrate are bonded to each other, e.g., electrically and mechanically. This is known as a flip-chip arrangement. For example, when using solder bumps, the solder bumps are typically remitted using hot air reflow. The flip-chip structure may be filled with an electrically insulating material, such as the filler 170, FIG. 1. The filling should be included under the structure of the flip-chip. In some embodiments, the structure may be encompassed within a package, such as a ceramic package.

All examples and conditional language recited herein are intended to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

While the present disclosed embodiments has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the disclosed embodiments. Furthermore, the foregoing detailed description has set forth a few of the many forms that the disclosed embodiments can take. It is intended that the foregoing detailed description be understood as an illustration of selected forms that the disclosed embodiments can take and not as a limitation to the definition of the disclosed embodiments.

What is claimed is:
1. A microchip structure, comprising:
a target integrated circuit (TIC) comprising a first surface and a first power contact at a first location on the first surface of the TIC, the TIC further comprising a second power contact at a second location on the first surface of the TIC;

a plurality of photovoltaic (PV) diodes deposited on a first surface of a transparent substrate, each of the plurality of PV diodes having an anode coupled to an anode contact and a cathode coupled to a cathode contact, wherein the transparent substrate is transparent to an electromagnetic (EM) frequency to which the plurality of PV diodes are sensitive; and wherein at least the cathode contact of a first PV diode of the plurality of PV diodes is bonded to the first power contact and at least the anode contact of a second PV diode of the plurality of PV diodes is bonded to the second power contact.

2. The microchip structure of claim 1, wherein the cathode contact of the first PV diode is at least one of: electrically bonded to the first power contact, and mechanically bonded to the first power contact.

3. The microchip structure of claim 1, wherein the anode contact of the second PV diode of the plurality of PV diodes is at least mechanically bonded to the second power contact.

4. The microchip structure of claim 1, wherein the transparent substrate is at made of least one of: glass and silicon.

5. The microchip structure of claim 1, wherein the EM frequency corresponds to any of: near ultraviolet, near infrared, mid infrared, and far infrared.

6. The microchip structure of claim 1, wherein the anode contact of the first PV diode is connected to a cathode contact of a third PV diode of the plurality of PV diodes.

7. The microchip structure of claim 6, wherein the anode contact of the third PV diode is connected to the cathode contact of the second PV diode.

8. The microchip structure of claim 7, wherein the transparent substrate further comprises a filter layer.

9. The microchip structure of claim 8, wherein the filter layer filters EM radiation corresponding to a plurality of EM frequencies including the EM frequency.

10. The microchip structure of claim 1, wherein the plurality of PV diodes are of the same type.

11. A method for manufacturing a microchip structure, comprising:

forming a plurality of photovoltaic (PV) diodes on a first surface of a transparent substrate, each of the plurality of PV diodes having an anode coupled to a respective anode contact and a cathode coupled to a respective cathode contact, wherein the transparent substrate is transparent to an electromagnetic (EM) frequency to which the plurality of PV diodes are sensitive, wherein each of the plurality of PV diodes includes a surface for receiving light to convert to electricity, wherein the surface of each of the plurality of PV diodes faces the transparent substrate such that the light for conversion to electricity can only be received at the plurality of PV diodes after passing through the transparent substrate;

bonding at least the cathode contact of a first PV diode of the plurality of PV diodes to a first power contact located at a first location on a first surface of a target integrated circuit (TIC); and bonding at least the anode contact of a second PV diode of the plurality of PV diodes to a second power contact located at a second location on the first surface of the TIC.

12. The method of claim 11, wherein the transparent substrate is made of at least one of: glass and silicon.

13. The method of claim 11, wherein the PV diodes are fabricated on the transparent substrate using chemical vapor deposition.

14. The method of claim 11, wherein the anode of the first PV diode is connected to a cathode of a third PV diode.

15. The method of claim 14, wherein the anode of the third PV diode is connected to a cathode of the second PV diode.

16. The method of claim 11, wherein the transparent substrate further comprises a filter layer through which light must pass before reaching the surface of the plurality of PV diodes that are for receiving light to convert to electricity.

17. The method of claim 11, wherein the filter layer is fabricated by depositing at least an element in the transparent substrate.

18. The method of claim 11, wherein the bonding is at least mechanical bonding.

* * * * *